United States Patent
Ikuta et al.

(10) Patent No.: US 7,368,403 B2
(45) Date of Patent: May 6, 2008

(54) SYNTHETIC QUARTZ GLASS FOR OPTICAL MEMBER, PROJECTION EXPOSURE APPARATUS AND PROJECTION EXPOSURE METHOD

(75) Inventors: Yoshiaki Ikuta, Kanagawa (JP); Noriyuki Agata, Fukushima (JP)

(73) Assignee: Asahi Glass Company, Limited, Tokyo (JP)

( * ) Notice: Subject to any disclaimer, the term of this patent is extended or adjusted under 35 U.S.C. 154(b) by 358 days.

(21) Appl. No.: 10/969,954

(22) Filed: Oct. 22, 2004

(65) Prior Publication Data

US 2005/0068644 A1    Mar. 31, 2005

Related U.S. Application Data

(63) Continuation of application No. PCT/JP03/05193, filed on Apr. 23, 2003.

(30) Foreign Application Priority Data

Apr. 23, 2002 (JP) ............................. 2002-120805

(51) Int. Cl.
    *C03C 3/06* (2006.01)
(52) U.S. Cl. .......................................... 501/54; 501/53
(58) Field of Classification Search ................. 501/53, 501/54
    See application file for complete search history.

(56) References Cited

U.S. PATENT DOCUMENTS

| 5,677,754 A | 10/1997 | Makinouchi |
| 6,499,317 B1 * | 12/2002 | Ikuta et al. ................... 65/378 |
| 6,656,860 B2 * | 12/2003 | Yoshida et al. ............... 501/54 |
| 7,082,790 B2 * | 8/2006 | Kuhn et al. ................... 65/17.4 |
| 2005/0068644 A1 | 3/2005 | Ikuta et al. |
| 2006/0183623 A1 | 8/2006 | Ikuta et al. |

FOREIGN PATENT DOCUMENTS

| EP | 1 094 040 A2 | 4/2001 |
| EP | 1 103 528 A2 | 5/2001 |
| EP | 1 125 897 A1 | 8/2001 |
| JP | 6-199539 A * | 7/1994 |
| JP | 9-52723 A * | 2/1997 |
| JP | 9-235134 A * | 9/1997 |
| JP | 2001-110710 A | 4/2001 |
| WO | WO 01/92175 A1 | 12/2001 |
| WO | WO 02/21217 A1 | 3/2002 |

OTHER PUBLICATIONS

Patent Abstracts of Japan, JP 09-235134, Sep. 9, 1997 (reference previously filed in Japanese language on Oct. 22, 2004).
Patent Abstracts of Japan, JP 09-052723, Feb. 25, 1997 (reference previously filed in Japanese language on Oct. 22, 2004).
Patent Abstracts of Japan, JP 06-199539, Jul. 19, 1994 (reference previously filed in Japanese language on Oct. 22, 2004).
Patent Abstracts of Japan, JP 2000-239040, Sep. 5, 2000.

* cited by examiner

*Primary Examiner*—Anthony J. Green
(74) *Attorney, Agent, or Firm*—Oblon, Spivak, McClelland, Maier & Neustadt, P.C.

(57) ABSTRACT

A synthetic quartz glass for an optical member, which is to be used in an optical device employing an ArF excimer laser beam as a light source at an energy density of at most 2 mJ/cm$^2$/pulse or in an optical device employing a KrF excimer laser beam as a light source at an energy density of at most 30 mJ/cm$^2$/pulse, characterized in that the hydrogen molecule concentration is within a range of at least $1 \times 10^{16}$ molecules/cm$^3$ and less than $5 \times 10^{16}$ molecules/cm$^3$.

2 Claims, 3 Drawing Sheets

SYNTHETIC QUARTZ GLASS FOR OPTICAL MEMBER, PROJECTION EXPOSURE APPARATUS AND PROJECTION EXPOSURE METHOD

TECHNICAL FIELD

The present invention relates to a synthetic quartz glass for an optical member to be used as a material for an optical component such as a lens, a prism, an etalon, a diffraction grating, a photomask, a pellicle (pellicle material and pellicle frame) and a material for windows, to be used in an optical device employing a KrF excimer laser (wavelength: 248 nm), an ArF excimer laser (wavelength: 193 nm) or the like as a light source, and the like.

BACKGROUND ART

Heretofore, in a photolithographic technology, an exposure apparatus has been widely utilized which transfers a fine circuit pattern on a wafer to produce an integrated circuit. Along with high integration and high functionality of an integrated circuit, an integrated circuit becomes finer, and an exposure apparatus is required to form an image of a circuit pattern with high resolution on a wafer with a deep focal depth, and shortening of the wavelength of the exposure light source is being advanced. The exposure light source has been advanced from conventional g-line (wavelength: 436 nm) or i-line (wavelength: 365 nm), and now, a KrF excimer laser (wavelength: 248 m) or an ArF excimer laser (wavelength: 193 nm) is being used.

For an optical member for an exposure apparatus employing a light having a wavelength of from 180 to 400 nm as a light source, a synthetic quartz glass has been mainly employed, since it is excellent in transparency over a wide range from a near infrared region to an ultraviolet region, it has an extremely small thermal expansion coefficient and it is relatively easily processed. As a conventionally employed synthetic quartz glass, one as disclosed in JP-A-3-88742 may, for example, be known. That is, a synthetic quartz glass having a OH group content of at least 10 ppm and containing hydrogen in an amount of at least $5 \times 10^{16}$ molecules/cm³ has been known.

When a synthetic quartz glass is irradiated with ultraviolet lights, defect precursors such as distorted three-membered ring structures or four-membered ring structures are dissociated to form paramagnetic defects such as an E' center (≡Si.) and NBOHC (≡SiO.). Such paramagnetic defects have absorption bands centered at a wavelength of 220 nm and at a wavelength of 260 nm, respectively, and thus the formation of the paramagnetic defects is a main cause of the decrease in the transmittance. Hydrogen molecules in the synthetic quartz glass are considered to have a function to convert the E' center and the NBOHC into ≡SiH and ≡SiOH having no absorption band centered at a wavelength of from 190 to 400 nm, respectively, and the above JP-A-3-88742 is a proposal which pays attention to this defect repairing effect of hydrogen molecules.

However, ≡SiH and ≡SiOH are dissociated by irradiation with ultraviolet lights and converted into the E' center and the NBOHC again, and accordingly the defect formation process during irradiation with ultraviolet lights is complicated, and it is considered that the following four processes are in progress.

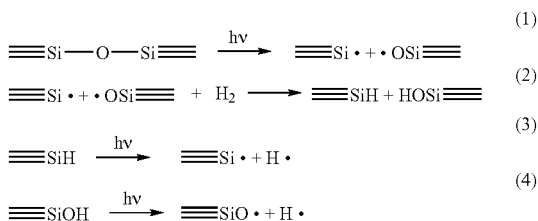

If the irradiation of the synthetic quartz glass with ultraviolet lights is intermitted, only the process of the above formula (2) proceeds, the E' center and the NBOHC which are present during the irradiation are sequentially converted to SiH and SiOH structures, and the synthetic quartz glass gradually recovers from the transmittance decreased state during the irradiation with ultraviolet lights. However, if the irradiation with ultraviolet lights is carried out again, two processes of the above formulae (3) and (4) immediately proceed, and the transmittance immediately decreases to the level immediately before intermission of the irradiation.

Here, in practical application to e.g. an optical member for a semiconductor exposure machine, as shown in FIG. 2, the irradiation with ultraviolet lights is carried out usually intermittently (this irradiation method is referred to as "burst mode") for alignment, wafer exchange, job change etc.

In such a case, the change in the transmittance decreases the control accuracy of the exposure amount and leads to deterioration in the pattern dimensional accuracy, and accordingly the change in the transmittance when the irradiation with ultraviolet lights is carried out intermittently is preferably as small as possible.

Particularly, the exposure amount of a semiconductor exposure machine is controlled usually by an illuminometer located between a projection lens and a light source. The change in the transmittance of the projection lens itself remarkably deteriorates the control accuracy of the exposure amount, and accordingly it is particularly desirable to employ a glass material with a small change in the transmittance. The above JP-A-3-88742 is a proposal intended to suppress the decrease in the transmittance when continuous irradiation with ultraviolet lights is carried out, simply by incorporating hydrogen molecules at a certain concentration or above, and the change in the transmittance in a case of irradiation under irradiation conditions close to the practical use conditions, i.e. by the burst mode, is not considered, and the synthetic quartz glass by the above proposal has a problem with the amount of the change in the transmittance in a case of irradiation with ultraviolet lights by the burst mode in some cases.

It is an object of the present invention to provide a synthetic quartz glass with a small decrease in the transmittance by irradiation with ultraviolet lights and with a small amount of the change in the transmittance when irradiated with ultraviolet lights intermittently.

DISCLOSURE OF THE INVENTION

With the purpose of reducing the change in the transmittance of the synthetic quartz glass when intermittently irradiated with ultraviolet lights, the present inventors have conducted extensive studies on the transmittance decrease behavior during the irradiation with ultraviolet lights, the transmittance recovery behavior after the irradiation with ultraviolet lights and the transmittance change behavior when further irradiated with ultraviolet lights again. As a result, they have reached a conclusion that to suppress the change in the transmittance of a synthetic quartz glass when intermittently irradiated with ultraviolet lights, it is insufficient to simply incorporate hydrogen molecules in the synthetic quartz glass at a certain concentration or above, and it is necessary to incorporate hydrogen molecules in an appropriate concentration range in the synthetic quartz glass.

Namely, when a synthetic quartz glass is irradiated with ultraviolet lights, the transmittance decreases due to formation of paramagnetic defects, however, the amount of decrease in the transmittance when the synthetic quartz glass is in a stable state by the irradiation tends to be smaller when the concentration of the hydrogen molecules which repair the paramagnetic defects is higher. This tendency is remarkable particularly when irradiation with ultraviolet lights having a high energy is carried out.

However, in the practical application field, the energy of ultraviolet lights is relatively low, and in a case of an optical member for an ArF excimer laser for example, the pulse energy density is at most 2 mJ/cm²/pulse, and in a case of an optical member for a KrF excimer laser, the pulse energy density is at most 30 mJ/cm²/pulse.

The present inventors have found that when the irradiation with ultraviolet lights having such a low energy density is carried out, since the concentration of paramagnetic defects formed by the irradiation with ultraviolet lights is low, the formed paramagnetic defects are repaired by the reaction of the formula (2) when hydrogen molecules are contained in an amount of at least $1 \times 10^{16}$ molecules/cm³, and the decrease in the transmittance in a stable state can be suppressed to a low level, and further, the amount of the decrease in the transmittance does not depends on the hydrogen molecule concentration so much within the above range.

On the other hand, the recovery rate from the decrease in the transmittance when the irradiation with ultraviolet lights is intermitted depends on the hydrogen molecule concentration, and the lower the hydrogen molecule concentration, the lower the recovery rate. Specifically, when the hydrogen molecule concentration in the synthetic quartz glass is less than $5 \times 10^{16}$ molecules/cm³, more preferably at most $4.5 \times 10^{16}$ molecules/cm³, the recovery rate from the decrease in the transmittance after the irradiation with ultraviolet lights can be made adequately low. When the irradiation is carried out again after the intermission of the irradiation with ultraviolet lights, the amount of the decrease in the transmittance immediately return to the level before the intermission of the irradiation with ultraviolet lights, but the rate depends only on the energy density of ultraviolet lights and does not depend on the material.

Accordingly, in order to decrease the amount of the change in the transmittance in a case of intermittent irradiation with ultraviolet lights, it is required to reduce the amount of the decrease in the transmittance during the irradiation with ultraviolet lights and to slow the recovery rate after the irradiation with ultraviolet lights. Specifically, they have found that when the hydrogen molecule concentration in the synthetic quartz glass is at least $1 \times 10^{16}$ and less than $5 \times 10^{16}$ molecules/cm³, an optical member with a small amount of the variation in the transmittance in a case of intermittent irradiation with ultraviolet lights can be obtained.

Namely, the present invention provides a synthetic quartz glass for an optical member, which is to be used in an optical device employing an ArF excimer laser beam as a light source at an energy density of at most 2 mJ/cm²/pulse or in an optical device employing a KrF excimer laser beam as a light source at an energy density of at most 30 mJ/cm²/pulse, characterized in that the hydrogen molecule concentration is within a range of at least $1 \times 10^{16}$ molecules/cm³ and less than $5 \times 10^{16}$ molecules/cm³, preferably within a range of at least $1 \times 10^{16}$ molecules/cm³ and at most $4.5 \times 10^{16}$ molecules/cm³.

Further, it provides a synthetic quartz glass for an optical member, which is to be used in an optical device employing an ArF excimer laser beam as a light source at an energy density of at most 2 mJ/cm²/pulse, characterized in that the hydrogen molecule concentration is within a range of at least $1 \times 10^{16}$ molecules/cm³ and less than $5 \times 10^{16}$ molecules/cm³, and when the amount of the decrease in the internal transmittance at a wavelength of 193 nm, when irradiated with the above ArF excimer laser beam so that the internal transmittance at a wavelength of 193 nm is in a stable state, is represented by $\Delta T_{193ST}$(%/cm), and the amount of the decrease in the internal transmittance at a wavelength of 193 nm, when the above irradiation with the ArF excimer laser beam is stopped for 50 seconds to recover the internal transmittance at a wavelength of 193 nm, is represented by $\Delta T_{193RC}$ (%/cm), the following relations are satisfied:

$$\Delta T_{193ST} < 0.2$$

$$(\Delta T_{193ST} - \Delta T_{193RC})/\Delta T_{193ST} < 0.1$$

Still further, it provides a synthetic quartz glass for an optical member, which is to be used in an optical device employing a KrF excimer laser beam as a light source at an energy density of at most 30 mJ/cm²/pulse, characterized in that the hydrogen molecule concentration is within a range of at least $1 \times 10^{16}$ molecules/cm³ and less than $5 \times 10^{16}$ molecules/cm³, and when the amount of the decrease in the internal transmittance at a wavelength of 248 nm, when irradiated with the above KrF excimer laser beam so that the internal transmittance at a wavelength of 248 nm is in a stable state, is represented by $\Delta T_{248ST}$ (%/cm), and the amount of the decrease in the internal transmittance at a wavelength of 248 nm, when the above irradiation with the KrF excimer laser beam is stopped for 50 seconds to recover the internal transmittance at a wavelength of 248 nm, is represented by $\Delta T_{248RC}$ (%/cm), the following relations are satisfied:

$$\Delta T_{248ST} < 0.2$$

$$(\Delta T_{248ST} - \Delta T_{248RC})/\Delta T_{248ST} < 0.1$$

EXPLANATION OF NUMERICAL REFERENCES

Figure 1:
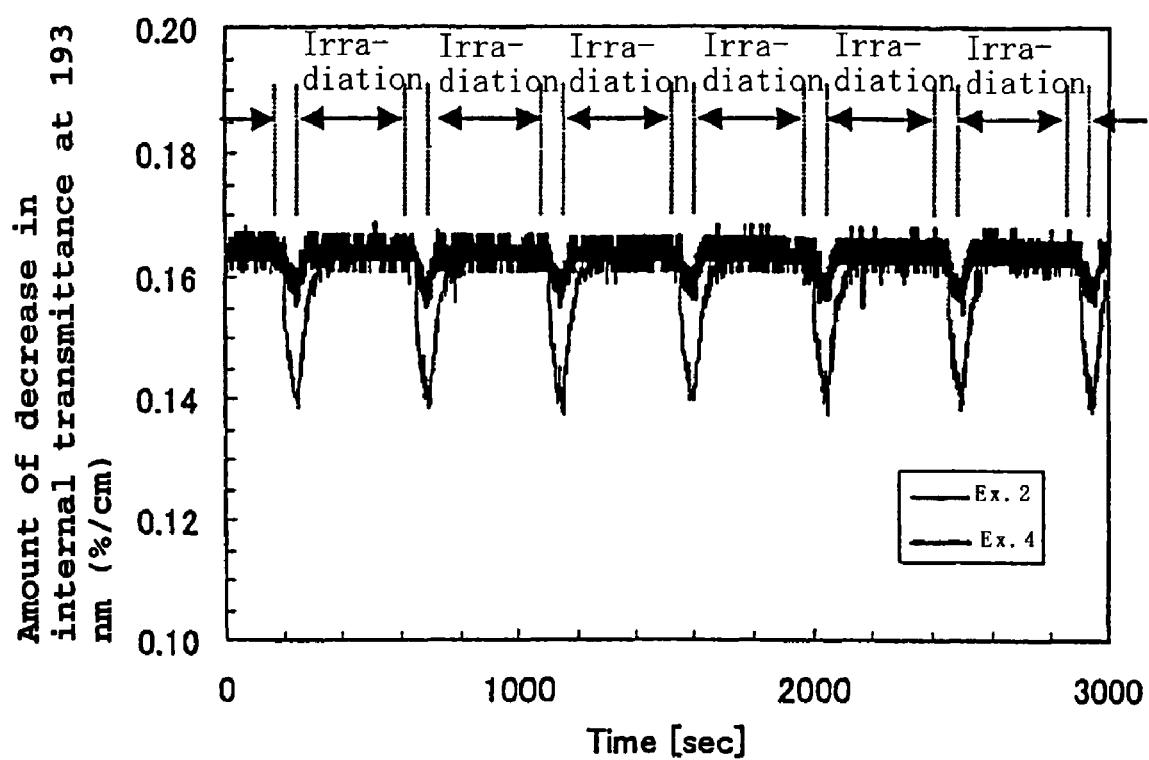
FIG. 1: A graph illustrating the variations of the amount of the decrease in the transmittance of synthetic quartz glasses of the present invention and Comparative Example.
Figure 2:
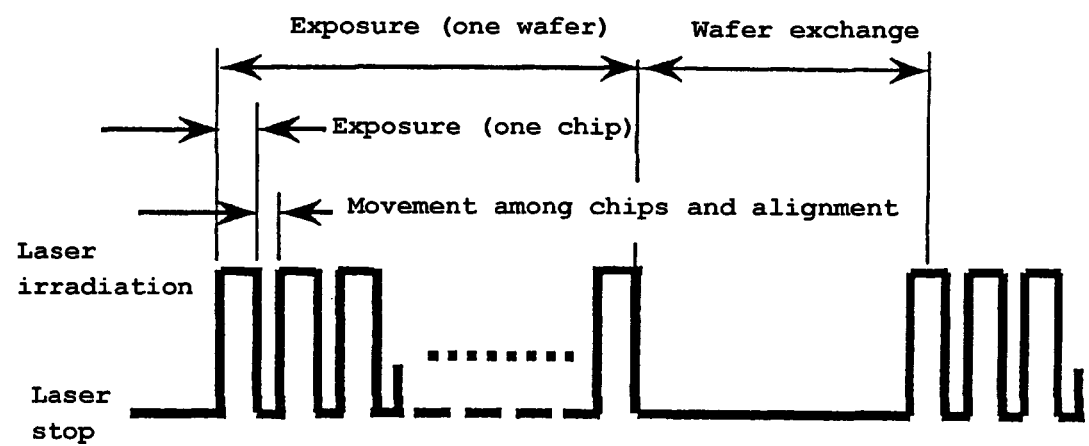
FIG. 2: A schematic view illustrating a typical pattern of laser irradiation of a semiconductor exposure machine.

1: ArF excimer laser apparatus
2: Power meter
3: Aperture
4: Beam splitter
5: Power meter
6: D2 lamp light source 7: Sample
8: Spectrophotometer

BEST MODE FOR CARRYING OUT THE INVENTION

The synthetic quartz glass of the present invention is preferably used in an optical device employing an ArF excimer laser beam as a light source at an energy density of at most 2 mJ/cm 2/pulse or in an optical device employing a KrF excimer laser beam as a light source at an energy density of at most 30 mJ/cm$^2$/pulse.

Further, the hydrogen molecular concentration is within a range of at least $1 \times 10^{16}$ molecules/cm$^3$ and less than $5 \times 10^{16}$ molecules/cm$^3$, preferably within a range of at least $1 \times 10^{16}$ molecules/cm$^3$ and at most $4.5 \times 10^{16}$ molecules/cm$^3$. Within such a range, the decrease in the transmittance due to the irradiation with ultraviolet lights can be suppressed, and at the same time, the amount of the change in the transmittance in a case of intermittent irradiation with ultraviolet lights can be suppressed.

Particularly, when the amount of the decrease in the internal transmittance at a wavelength of 193 nm, when irradiated with an ArF excimer laser beam having an energy density of at most 2 mJ/cm$^3$/pulse so that the internal transmittance at a wavelength of 193 nm is in a stable state, is represented by $\Delta T_{193ST}$ (%/cm), and the amount of the decrease in the internal transmittance at a wavelength of 193 nm, when the above irradiation with the ArF excimer laser beam is stopped for 50 seconds to recover the internal transmittance at a wavelength of 193 nm, is represented by $\Delta T_{193RC}$ (%/cm), the following relations are satisfied:

$$\Delta T_{193ST} < 0.2$$

$$(\Delta T_{193ST} - \Delta T_{193RC})/\Delta T_{193ST} < 0.1$$

Further, when the amount of the decrease in the internal transmittance at a wavelength of 248 nm, when irradiated with a KrF excimer laser beam having an energy density of at most 30 mJ/cm$^2$/pulse so that the internal transmittance at a wavelength of 248 nm is in a stable state, is represented by $\Delta T_{248ST}$ (%/cm), and the amount of the decrease in the internal transmittance at a wavelength of 248 nm, when the above irradiation with the KrF excimer laser beam is stopped for 50 seconds to recover the internal transmittance at a wavelength of 248 nm, is represented by $\Delta T_{248RC}$ (%/cm), the following relations are satisfied.

$$\Delta T_{248ST} < 0.2$$

$$(\Delta T_{248ST} - \Delta T_{248RC})/\Delta T_{248ST} < 0.1$$

By satisfying the above conditions, a synthetic quartz glass for an optical member suitable for a projection exposure apparatus to stably carry out projection exposure can be obtained.

In the present invention, oxygen deficient defects ($\equiv$Si—Si$\equiv$ ($\equiv$ represents Si—O bond, the same applies hereinafter)), oxygen excess defects ($\equiv$Si—O—O—Si$\equiv$), $\equiv$SiH bonds, dissolved oxygen molecules etc. in the synthetic quartz glass have bad influences over the light transmittance and the durability to the light, and accordingly, preferably they are not substantially contained.

In the present invention, metal impurities such as alkali metals (e.g. Na, K, Li), alkaline earth metals (e.g. Mg, Ca) and transition metals (e.g. Fe, Ni, Cr, Cu, Mo, W, Al, Ti, Ce) in the synthetic quartz glass not only reduce the initial light transmittance in a region from an ultraviolet region to a vacuum ultraviolet region but also may cause deterioration of the durability to the light. Accordingly, their contents are preferably as low as possible. Specifically, the total content of metal impurities is preferably at most 100 ppb, particularly preferably at most 50 ppb.

In the present invention, the OH groups in the synthetic quartz glass may cause red photoluminescence or NBOHC formation at the time of the irradiation with ultraviolet lights, and accordingly the concentration is preferably at most 100 ppm.

In the present invention, chlorine in the synthetic quartz glass deteriorates the light transmittance and the durability to the light in a vacuum ultraviolet region, and accordingly its content is preferably low. Specifically, the chlorine content in the synthetic quartz glass is preferably at most 100 ppm, particularly preferably at most 10 ppm, more preferably it is not substantially contained.

In the present invention, the strained structures in the synthetic quartz glass are defect precursors of the E' center or the NBOHC to be formed by the irradiation with ultraviolet lights, and accordingly the concentration is preferably low. Specifically, the ratios of the scattering peak intensity $I_{495}$ at 495 cm$^{-1}$ and the scattering peak intensity $I_{606}$ at 606 cm$^{-1}$, to the scattering peak intensity $I_{440}$ at 440 cm$^{-1}$ in the laser Raman spectrum, $I_{495}/I_{440}$ and $I_{606}/I_{440}$ are preferably at most 0.585 and at most 0.136, respectively.

In the present invention, as a method for producing the synthetic quartz glass, a direct method, a soot method (including VAD method, OVD method etc.) or a plasma method may, for example, be mentioned. Particularly preferred is a soot method in view of the low temperature at the time of production and with a due to avoiding inclusion of impurities such as metals.

A projection exposure apparatus employing the synthetic quartz glass of the present invention as an optical member is very suitable for stable projection exposure. However, if the laser non-irradiation time is extremely long, it may be long before the transmittance recovered during the non-irradiation time decreases to the stable state again in some cases.

Accordingly, the present invention further provides a projection exposure method, which comprises projection exposure of a pattern image of a mask on a substrate by means of a projection optical system employing a light having a wavelength of from 180 to 400 nm as a light source, characterized in that when irradiation with a light from a light source is intermitted for at least 30 minutes, and then irradiation with a light from a light source is carried out again to carry out exposure, an act of continuous dummy irradiation with a light from a light source for at least 30 seconds is carried out before the exposure. By doing this, the transmittance which recovered during the non-irradiation time decreases to the stable state again during the dummy irradiation, whereby projection exposure with a small change in the transmittance can be carried out. In this case also, it is very preferred to use the synthetic quartz glass of the present invention for an optical member of the projection exposure apparatus.

Now, the present invention will be explained in further detail with reference to Examples of the present invention and Comparative Examples. However, the present invention is by no means restricted to such specific Examples.

EXAMPLES 1 TO 7

A synthetic quartz glass (diameter 200 mm×thickness 30 mm) was prepared by means of a VAD method by using SiCl$_4$ as a Si source material, and a hydrogen doping treatment was carried out under conditions as shown in Table 1 to prepare samples having different hydrogen molecule concentrations. Finally, from substantially the center portion of the face of 200 mm in diameter, a sample of 30 mm square×20 mm in thickness was cut out, and facing two faces of 30 mm square of each sample and facing two faces of 30 mm×20 mm of each sample were mirror-polished to prepare a sample for evaluation. Examples 4 and 5 are Examples of the present invention and the others are Comparative Examples.

TABLE 1

| | Hydrogen treatment conditions (atmosphere, total pressure, temperature, time) | Hydrogen concentration (molecules/cm³) |
|---|---|---|
| Ex. 1 | $H_2$ = 100%, 50 atm, 500° C., 200 hr | $4.7 \times 10^{18}$ |
| Ex. 2 | $H_2$ = 100%, 10 atm, 500° C., 200 hr | $1.1 \times 10^{18}$ |
| Ex. 3 | $H_2$ = 100%, 5 atm, 500° C., 200 hr | $5.1 \times 10^{17}$ |
| Ex. 4 | $H_2$/He = 40/60%, 1 atm, 500° C., 200 hr | $4.1 \times 10^{16}$ |
| Ex. 5 | $H_2$/He = 20/80%, 1 atm, 500° C., 200 hr | $2.2 \times 10^{16}$ |
| Ex. 6 | $H_2$/He = 6/94%, 1 atm, 500° C., 200 hr | $5.9 \times 10^{15}$ |
| Ex. 7 | Nil | $<3 \times 10^{15}$ |

(Evaluation of Hydrogen Concentration)

By using a temperature programmed desorption mass spectrometer (manufactured by Denshi Kagaku K.K.), a sample with a size of 10 mm square×1 mm in thickness was heated from room temperature to 1500° C. over a period of about 60 minutes, and the ion intensity of the hydrogen gas discharged from the sample during this temperature raising was measured to evaluate the hydrogen molecule concentration in the sample. The limit of detection by this method is $5 \times 10^{15}$ molecules/cm³. Here, the hydrogen molecule concentration in the synthetic quartz glass can not directly be obtained by this method, and accordingly temperature programmed desorption mass spectrometry was carried out with respect to the sample, the hydrogen molecule concentration of which has been known by preliminarily carrying out Raman spectrometry, to preliminarily obtain the correlation between the hydrogen molecule concentration by Raman spectrometry and the gas ion intensity by temperature programmed desorption mass spectrometry, and this correlation was employed.

The method of evaluating the hydrogen molecule concentration by Raman spectrometry is as follows. The hydrogen molecule content (molecules/cm³) was obtained from the intensity ratio ($I_{4160}/I_{800}$) of the intensity $I_{4160}$ detected from the Raman scattering peak at 4135 cm⁻¹ in the laser Raman spectrum to the intensity $I_{800}$ of the scattering peak at 800 cm⁻¹ representing the fundamental vibration between silicon and oxygen (V. S. Khotimchenko, et. al., Zhurnal Prikladnoi Spektroskopii, Vol. 46, No. 6, PP. 987-997, 1986). Here, the limit of detection by this method is $3 \times 10^{16}$ molecules/cm³.

(Evaluation of Durability to the Light)

Substantially the center portion of the face of 30 mm square of each sample was irradiated with an ArF excimer laser beam in a direction perpendicular to the face, to evaluate the durability to the light. A state where the decrease in the internal transmittance was stabilized was obtained by continuous irradiation of $5 \times 10^9$ pulses at an energy density of 1 mJ/cm²/pulse at a frequency of 2000 Hz, and then intermittent irradiation was carried out, that is, a cycle comprising irradiation for 200 seconds, intermission of the irradiation for 50 seconds and irradiation for 200 seconds again, was carried out repeatedly, and the change in the transmittance during the cycles was evaluated. The size of the irradiated portion was 3 mm (horizontal)×10 mm (vertical).

Figure 3:
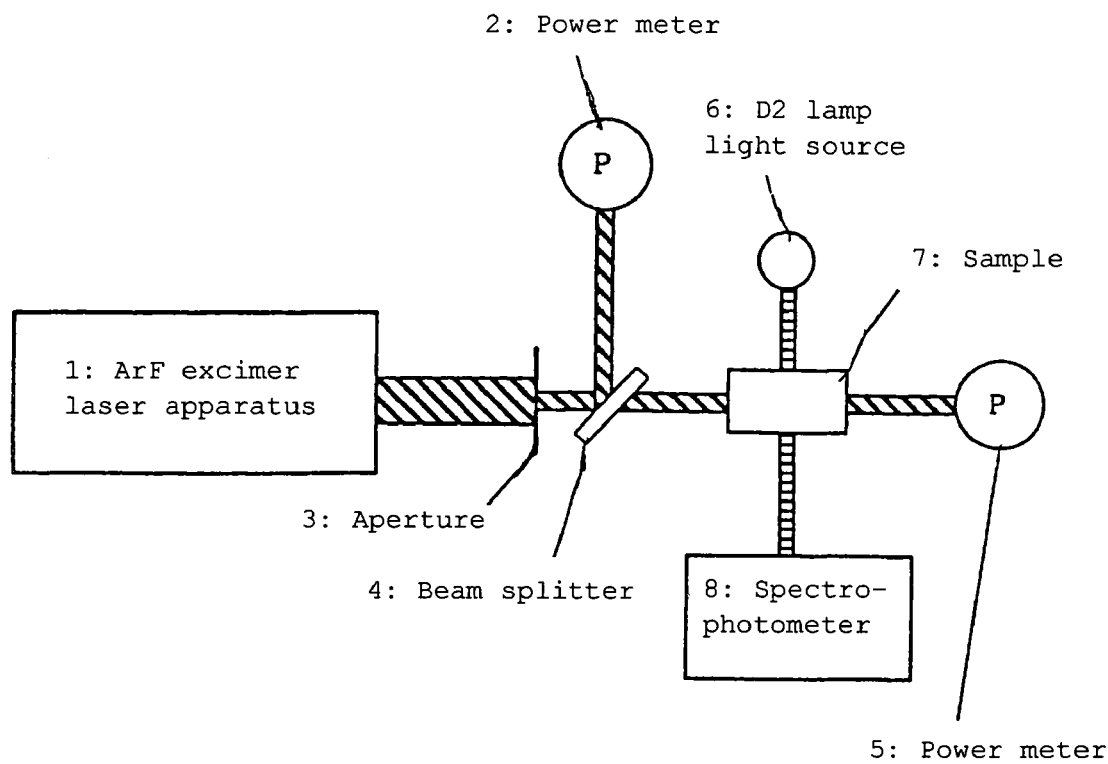
FIG. 3: A schematic view illustrating a transmittance measuring apparatus.

Evaluation of the amount of the change in the transmittance at a wavelength of 193 nm, $\Delta T_{193}$ (%/cm), was carried out by an apparatus shown in FIG. 3, and carried out by measuring the transmittance at a wavelength of 220 nm which is the center wavelength of the color center.

$\Delta k_{220}$=ln (initial transmittance/transmittance during measurement)

$\Delta T_{193}$=(1−exp(−$\Delta k_{220}$×0.6))×100

In FIG. 3, a laser beam radiated from an ArF excimer laser apparatus 1 (manufactured by LAMBDA PHYSIK GMBH) is split by a beam splitter 4 via an aperture 3, one light beam enters a sample 7, and the intensity of the transmitted light is measured by a power meter 5 (manufactured by Coherent, Inc.). The intensity of the other light beam split by the beam splitter 4 is directly measured by a power meter 2 (manufactured by Coherent, Inc.), and the intensity of the ArF excimer laser beam is controlled by the above two power meters. On the other hand, a light from a D2 lamp light source 6 is made to enter the sample 7, and the intensity of the light which exits from the sample 7 is measured by a spectrophotometer 8 (manufactured by Otsuka Electronics Co., Ltd.) to measure the transmittance at a wavelength of 220 nm.

Here, according to the analysis of the absorption spectrum, the amount of the change of the absorption coefficient at a wavelength of 193 nm is about 60% of the amount of the change of the absorption coefficient at a wavelength of 220 nm, and accordingly it can be obtained by multiplying the amount of the change of the absorption coefficient at a wavelength of 220 nm by 0.6.

The evaluation results are shown in Table 2. $\Delta T_1$ represents the maximum value of the amount of the decrease in the transmittance (maximum amount of the decrease in the transmittance during the irradiation), $\Delta T_2$ represents the minimum value of the amount of the decrease in the transmittance (minimum amount of the decrease in the transmittance during the intermission of the irradiation), and the amount of the variation of the amount of the decrease in the transmittance is taken as $\Delta T_1 - \Delta T_2$. Further, FIG. 1 is a graph illustrating the variations of the amount of decrease in the transmittance of Examples 2 and 4.

TABLE 2

Amount of decrease in transmittance at a wavelength of 193 nm in the case of intermittent irradiation with ArF excimer laser beam

| | Maximum value $\Delta T_1$ | Minimum value $\Delta T_2$ | Amount of variation $\Delta T_1 - \Delta T_2$ | $(\Delta T_1 - \Delta T_2)/\Delta T_1$ |
|---|---|---|---|---|
| Ex. 1 | 0.160 | 0.125 | 0.035 | 0.218 |
| Ex. 2 | 0.161 | 0.137 | 0.024 | 0.149 |
| Ex. 3 | 0.162 | 0.140 | 0.022 | 0.136 |
| Ex. 4 | 0.163 | 0.152 | 0.011 | 0.067 |
| Ex. 5 | 0.165 | 0.156 | 0.009 | 0.055 |
| Ex. 6 | 0.243 | 0.234 | 0.009 | 0.037 |
| Ex. 7 | 3.853 | 3.850 | 0.003 | 0.0008 |

INDUSTRIAL APPLICABILITY

As evident from Table 2, the synthetic quartz glass of the present invention is suitable as an optical member of a projection exposure apparatus, particularly as an optical member of a projection system, and makes it possible to carry out projection exposure stably with a small change in the transmittance.

The entire disclosure of Japanese Patent Application No. 2002-120805 filed on Apr. 23, 2002 including specification, claims, drawings and summary is incorporated herein by reference in its entirety.

What is claimed is:

1. A synthetic quartz glass for an optical member, which is to be used in an optical device employing an ArF excimer laser beam as a light source at an energy density of at most 2 mJ/cm²/pulse, comprising:

a hydrogen molecule concentration that is within a range of at least $1\times10^{16}$ molecules/cm³ and less than $5\times10^{16}$ molecules/cm³, an OH group concentration that is at most 100 ppm, and the synthetic quartz glass satisfies $\Delta T_{193ST}<0.2$ and $(\Delta T_{193ST}-\Delta T_{193RC})/\Delta T_{193ST}<0.1$, wherein $\Delta T_{93ST}$ (%/cm) represents an amount of decrease in an internal transmittance when the synthetic quartz glass is irradiated with the ArF excimer laser beam so that the internal transmittance at a wavelength of 193 nm emitted by the ArF excimer laser beam at the energy density of at most 2 mJ/cm²/pulse is in a stable state, and $\Delta T_{193ST}$ (%/cm) represents an amount of a decrease in the internal transmittance at the wavelength of 193 nm, when the irradiation with the ArF excimer laser beam is stopped for 50 seconds to recover the internal transmittance at a wavelength of 193 nm, and the synthetic quartz glass contains no fluorine.

2. A synthetic quartz glass for an optical member, which is to be used in an optical device employing a KrF excimer laser beam as a light source at an energy density of at most 30 mJ/cm²/pulse, comprising:

a hydrogen molecule concentration that is within a range of at least $1\times10^{16}$ molecules/cm³ and less than $5\times10^{16}$ molecules/cm³, an OH group concentration that is at most 100 ppm, and the synthetic quartz glass satisfies $\Delta T_{248ST}<0.2$ and $(\Delta T_{248ST}-\Delta T_{248RC})/\Delta T_{248ST}<0.1$, wherein $\Delta T_{248ST}$ represents a decrease in an internal transmittance when the synthetic quartz glass is irradiated with the KrF excimer laser beam so that the internal transmittance at a wavelength of 248 nm emitted by the KrF excimer laser beam at the energy density of at most 30 mJ/cm²/pulse is in a stable state, and $\Delta T_{245RC}$ (%/cm) represents an amount of a decrease in the internal transmittance at a wavelength of 248 nm, when the irradiation with the KrF excimer laser beam is stopped for 50 seconds to recover the internal transmittance at a wavelength of 248 nm, and the synthetic quartz glass contains no fluorine.

* * * * *